(12) United States Patent
Yagi (10) Patent No.: US 8,652,875 B2
(45) Date of Patent: Feb. 18, 2014

(54) METHOD OF MANUFACTURING A THIN-FILM TRANSISTOR

(71) Applicant: Sony Corporation, Tokyo (JP)

(72) Inventor: Iwao Yagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/626,275

(22) Filed: Sep. 25, 2012

(65) Prior Publication Data

US 2013/0029462 A1 Jan. 31, 2013

Related U.S. Application Data

(62) Division of application No. 13/015,972, filed on Jan. 28, 2011.

(30) Foreign Application Priority Data

Feb. 3, 2010 (JP) ................. 2010-022161

(51) Int. Cl.
*H01L 51/40* (2006.01)

(52) U.S. Cl.
USPC ........ 438/99; 438/151; 257/40; 257/E51.025; 257/E51.003

(58) Field of Classification Search
None
See application file for complete search history.

(56) References Cited

U.S. PATENT DOCUMENTS

| | | | | |
|---|---|---|---|---|
| 5,677,211 A | * | 10/1997 | Kaneko | 438/158 |
| 5,751,020 A | * | 5/1998 | Lyu | 257/72 |
| 7,276,728 B2 | * | 10/2007 | Iechi et al. | 257/40 |
| 2005/0179036 A1 | * | 8/2005 | Yamazaki et al. | 257/66 |
| 2006/0214160 A1 | * | 9/2006 | Furukawa et al. | 257/40 |
| 2010/0219402 A1 | * | 9/2010 | Katsuhara et al. | 257/40 |
| 2012/0007060 A1 | * | 1/2012 | Ushikura et al. | 257/40 |
| 2012/0313150 A1 | * | 12/2012 | Katsuhara | 257/288 |

FOREIGN PATENT DOCUMENTS

WO 2007-055119 5/2007

* cited by examiner

*Primary Examiner* — Minh-Loan T Tran
*Assistant Examiner* — Fazli Erdem
(74) *Attorney, Agent, or Firm* — K&L Gates LLP (57) ABSTRACT

A method of manufacturing a thin film transistor is provided. The method includes forming a lower organic semiconductor layer, forming an upper organic semiconductor layer on the lower organic semiconductor layer, the upper organic semiconductor layer having solubility and conductivity higher than those of the lower organic semiconductor layer, forming a source electrode and a drain electrode spaced apart from each other and respectively overlapping the upper organic semiconductor layer, and dissolving the upper organic semiconductor layer selectively by using the source electrode and the drain electrode as a mask.

5 Claims, 5 Drawing Sheets

METHOD OF MANUFACTURING A THIN-FILM TRANSISTOR

CROSS REFERENCES TO RELATED APPLICATIONS

The present application is a divisional of U.S. patent application Ser. No. 13/015,972, filed on Jan. 28, 2011, which claims priority to Japanese Priority Patent Application JP 2010-022161 filed in the Japan Patent Office on Feb. 3, 2010, the entire content of which is hereby incorporated by reference.

BACKGROUND

The present application relates to a thin-film transistor having an organic semiconductor layer, a method of manufacturing the thin-film transistor, and an electronic device using the thin-film transistor.

In recent years, an active matrix drive system has been introduced into many electronic devices represented by a display device, and a thin-film transistor (TFT) is used as an element for the switching (pixel selection).

Figure 9:
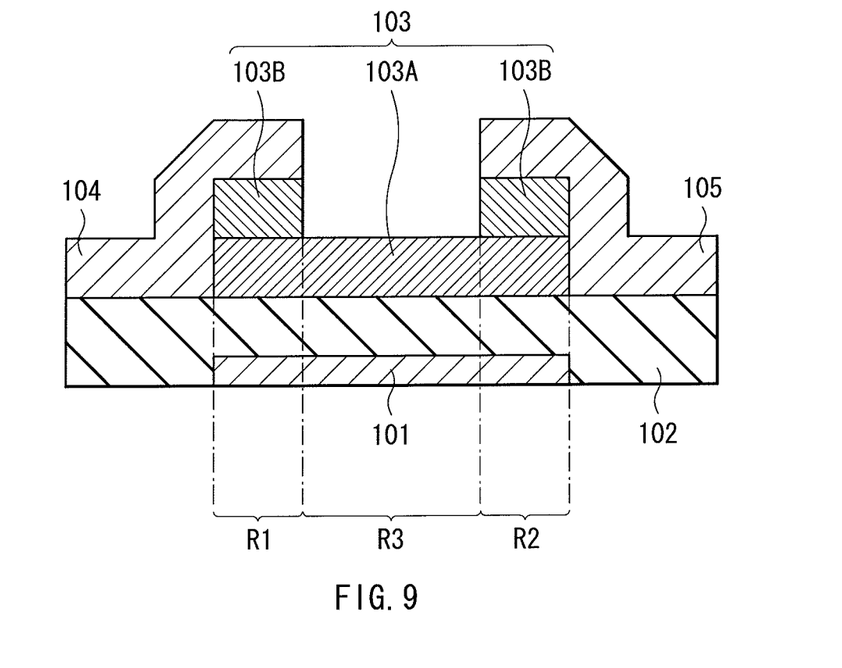
FIG. 9 is a cross-sectional diagram illustrating a configuration of a thin-film transistor in the past.

FIG. 9 illustrates a cross-sectional configuration of a channel etch type of TFT in the past. In this TFT, a semiconductor layer 103 is formed on a gate electrode 101 and a gate insulating layer 102, and a source electrode 104 and a drain electrode 105 are connected to the semiconductor layer 103. The source electrode 104 and the drain electrode 105 are spaced apart from each other and respectively disposed to be overlaid on an upper part of the semiconductor layer 103.

Regions R1 to R3 illustrated in FIG. 9 represent regions determined by a positional relationship between the semiconductor layer 103 and the source electrode 104 as well as the drain electrode 105. The region R1 is where the semiconductor layer 103 overlaps the source electrode 104, and the region R2 is where the semiconductor layer 103 overlaps the drain electrode 105. Further, the region R3 is located between the regions R1 and R2, and where the semiconductor layer 103 overlaps neither the source electrode 104 nor the drain electrode 105. What is meant by these regions R1 to R3 remains the same hereinafter.

The semiconductor layer 103 which is a channel layer has a layered structure in which an upper semiconductor layer 103B is formed on a lower semiconductor layer 103A. The lower semiconductor layer 103A is formed of amorphous silicon, and extends from the region R1 via the region R3 to the region R2. The upper semiconductor layer 103B is formed of amorphous silicon doped n-type and is disposed on each of the regions R1 and R2 so that the respective upper semiconductor layers 103B are spaced apart from each other.

When such a semiconductor layer 103 is formed, first, the lower semiconductor layer 103A and the upper semiconductor layer 103B are formed to extend from the region R1 to the region R2 and then, the source electrode 104 and the drain electrode 105 are formed. Subsequently, the upper semiconductor layer 103B is selectively etched by using the source electrode 104 and the drain electrode 105 as a mask. As a result, a part of the upper semiconductor layer 103B is removed in the region R3 and thus, the upper semiconductor layer 103B remains only in each of the regions R1 and R2.

In this channel etch type of TFT, electrical resistance of the n-type-doped upper semiconductor layer 103B becomes lower than electrical resistance of the lower semiconductor layer 103A not doped n-type. As a result, contact resistance between the source electrode 104 as well as the drain electrode 105 and the upper semiconductor layer 103B decreases and thus, an electric charge becomes easy to go in and out between the source electrode 104 as well as the drain electrode 105 and the semiconductor layer 103.

Incidentally, an organic TFT using the organic semiconductor layer as a channel layer has been receiving attention recently. In the organic TFT, the channel layer can be formed by coating, which makes it possible to reduce the cost. In addition, the channel layer can be formed at a temperature lower than an evaporation method and the like and thus, the organic TFT can be implemented on a low heat-resistant flexible plastic film or the like.

Figure 10:
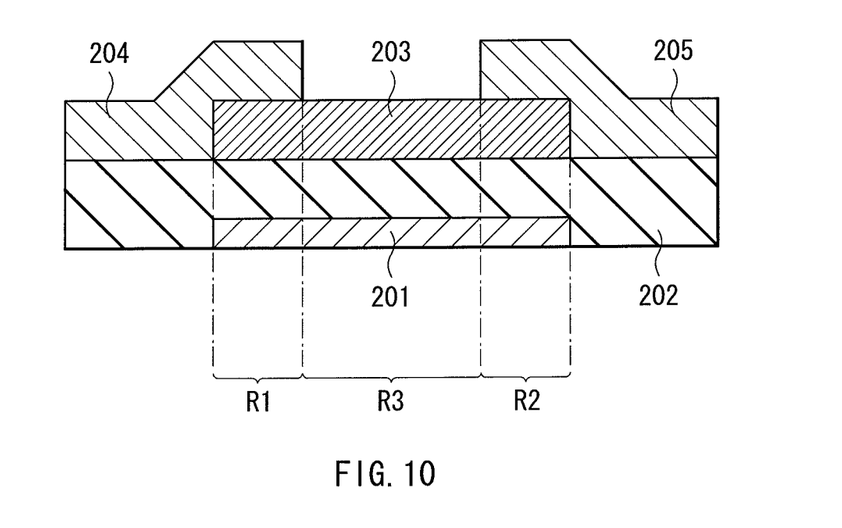
FIG. 10 is a cross-sectional diagram illustrating a configuration of an organic thin-film transistor in the past.

FIG. 10 illustrates a cross-sectional configuration of the organic TFT in the past. This organic TFT has a structure similar to the TFT illustrated in FIG. 9, except that has an organic semiconductor layer 203 in replace of the semiconductor layer 103. Specifically, the organic semiconductor layer 203 is formed on a gate electrode 201 and a gate insulating layer 202, and a source electrode 204 and a drain electrode 205 are connected to the organic semiconductor layer 203. This organic semiconductor layer 203 has a single-layered structure, and extends from the region R1 to the region R2.

As a structure of this organic TFT, like TFTs in the past, various kinds of structure such as a top contact type, a bottom contact type, a top gate type and a bottom gate type are considered. Above all, the top contact type in which the source electrode and the drain electrode are disposed to be overlaid on an upper part of the organic semiconductor layer is common (for example, see International Publication WO2007/055119)

SUMMARY

In order to make use of an advantage of the organic TFT to thereby make an electronic device thinner and more flexible, it is strongly desired to improve the performance of the organic TFT, in particular, the mobility and the ON/OFF ratio.

Thus, application of the structure of the channel etch type illustrated in FIG. 9 to the organic TFT has been studied, but this attempt is in a difficult situation resulting from the channel layer being an organic semiconductor. This is because, in order to remove the organic semiconductor, oxygen plasma etching to burn an organic matter is generally used, but in this etching, it is difficult to etch the organic semiconductor (only a necessary part) selectively. In this case, if the organic semiconductor composed of two layers is formed and then only an upper layer is etched, a lower layer is not a little etched. As a result, the thickness of the lower layer decreases and at the same time, the property deteriorates due to damage caused at the time of etching.

In view of the foregoing, it is desirable to provide a thin-film transistor, a method of manufacturing the thin-film transistor, and an electronic device, which can improve performance of the thin-film transistor.

According to an embodiment, there is provided a thin-film transistor including: an organic semiconductor layer; and a source electrode and a drain electrode spaced apart from each other and disposed to respectively overlap the organic semiconductor layer. This organic semiconductor layer includes a lower organic semiconductor layer, and an upper organic semiconductor layer formed on the lower organic semiconductor layer and having solubility and conductivity higher than the lower organic semiconductor layer. The lower organic semiconductor layer extends from a region overlapping the source electrode to a region overlapping the drain electrode, while the upper organic semiconductor layer is disposed in each of the region overlapping the source electrode and the region overlapping the drain electrode so that the respective upper organic semiconductor layers are spaced apart from each other. Further, an electronic device according to an embodiment includes the above-described thin-film transistor.

According to an embodiment, there is provided a method of manufacturing a thin-film transistor and including steps of: forming a lower organic semiconductor layer; and forming an upper organic semiconductor layer on the lower organic semiconductor layer, the upper organic semiconductor layer having solubility and conductivity higher than those of the lower organic semiconductor layer. Further, the method includes steps of: forming a source electrode and a drain electrode spaced apart from each other and respectively overlapping the upper organic semiconductor layer; and dissolving the upper organic semiconductor layer selectively by using the source electrode and the drain electrode as a mask.

According to the thin-film transistor and the method of manufacturing the same, as well as the electronic device of the embodiments, the upper organic semiconductor layer has the solubility and the conductivity higher than those of the lower organic semiconductor layer. In this case, the upper organic semiconductor layer is removed selectively by simple dissolution processing using a solvent such as an organic solvent, even if oxygen plasma etching is not used. Thus, the lower organic semiconductor layer is formed to extend from the region overlapping the source electrode to the region overlapping the drain electrode, and the upper organic semiconductor layer is formed in each of the region overlapping the source electrode and the region overlapping with the drain electrode so that the respective upper organic semiconductor layers are spaced apart from each other. Therefore, a channel etch type of thin-film transistor provided with the organic semiconductor layer is produced easily with stability. Accordingly, the mobility and the ON-OFF ratio improve and thus, the performance can be improved.

Additional features and advantages are described herein, and will be apparent from the following Detailed Description and the figures.

DETAILED DESCRIPTION

Figure 1:
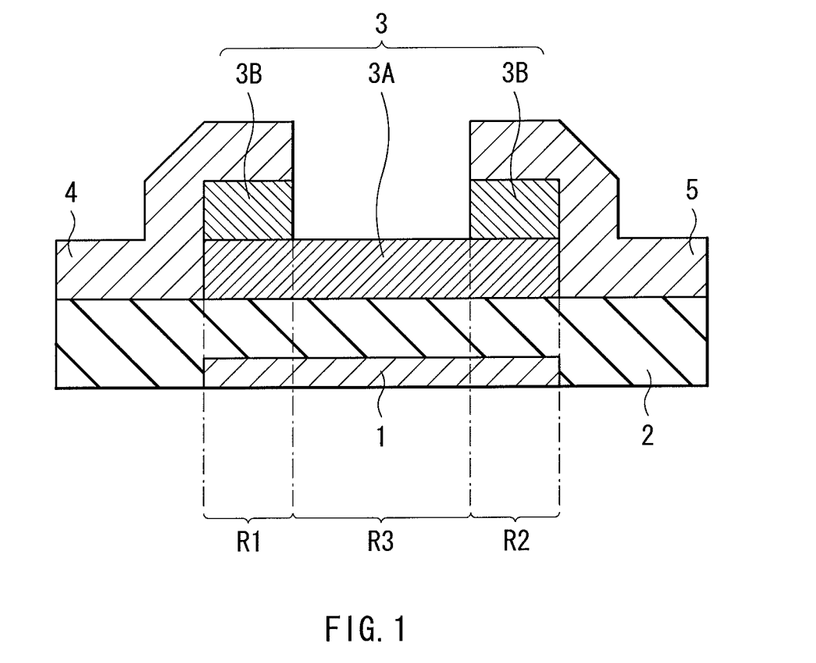
FIG. 1 is a cross-sectional diagram illustrating a configuration of a thin-film transistor in one embodiment.

Embodiments of the present application will be described below in detail with reference to the drawings.
1. Thin-film transistor (organic TFT) and method of manufacturing the same
2. Application example (electronic device) of thin-film transistor (organic TFT)
  2-1. Liquid crystal display device
  2-2. Organic EL display device
  2-3. Electronic paper display device 1. Organic TFT and Method of Manufacturing the Same Entire Configuration of Thin-Film Transistor FIG. 1 illustrates a cross-sectional configuration of an organic TFT that is a thin-film transistor in one embodiment.

The organic TFT is a TFT in which an organic semiconductor layer 3 is disposed to face a gate electrode 1 via a gate insulating layer 2, and a source electrode 4 and a drain electrode 5 are connected to the organic semiconductor layer 3. The source electrode 4 and the drain electrode 5 are spaced apart (separated) from each other and disposed to respectively overlap the organic semiconductor layer 3.

The organic TFT described here is a top-contact bottom-gate type in which the gate electrode 1 is located lower than the organic semiconductor layer 3, and the source electrode 4 and the drain electrode 5 are overlaid on the organic semiconductor layer 3.

The gate electrode 1 is formed of, for example, one or more kind of metallic material, inorganic conductive material, organic conductive material, and carbon material. The metallic material is, for example, aluminum (Al), copper (Cu), molybdenum (Mo), titanium (Ti), chromium (Cr), nickel (Ni), palladium (Pd), gold (Au), silver (Ag), platinum (Pt), or an alloy including any of them. The inorganic conductive material is, for example, indium oxide ($In_2O_3$), indium tin oxide (ITO), indium oxide zinc (IZO), or zinc oxide (ZnO). The organic conductive material is, for example, polyethylene dioxythiophene (PEDOT), or polystyrene sulfonate (PSS). The carbon material is graphite or the like. Incidentally, the gate electrode 1 may be formed of two or more laminated layers made of any of the above-described various kinds of material, and the gate insulating layer 2, the organic semiconductor layer 3, the source electrode 4 and the drain electrode 5 to be described later also may be similarly formed of such lamination.

The gate insulating layer 2 is formed of, for example, one or more kind of inorganic insulating material or organic insulating material. The inorganic material is, for example, silicon oxide (SiOx), silicon nitride (SiNx), aluminum oxide ($Al_2O_3$), titanium oxide ($TiO_2$), hafnium oxide (HfOx), or barium titanate ($BaTiO_3$). The organic insulating material is polyvinyl phenol (PVP), polyimide, polymethacrylic acid acrylate, photosensitive polyimide, photosensitive novolac resin, poly-para-xylylene, or the like.

The organic semiconductor layer 3 has a layered structure in which an upper organic semiconductor layer 3B is formed on a lower organic semiconductor layer 3A. Incidentally, each of the lower organic semiconductor layer 3A and the upper organic semiconductor layer 3B may be a single layer or a multilayer.

The lower organic semiconductor layer 3A extends from a region R1 overlapping the source electrode 4 to a region R2 overlapping the drain electrode 5, and is formed of one or more kind of organic semiconductor material. Such an organic semiconductor material is acene, its derivative, or the like. The acene is naphthacene, pentacene, hexacene, heptacene, dibenzo pentacene, tetrabenzo pentacene, pyrene, dibenzopyrene, chrysene, perylene, coronene, Terylene, ovalene, quaterrylene, circumanthracene, or the like. The derivative of the acene is, for example, a material in which a part of carbon (C) is replaced with other element such as nitrogen (N), sulfur (S), or oxygen (O), or a material in which the group is partially replaced with a functional group such as a carbonyl group. Specific examples of this derivative include triphenodioxazine, triphenodithiazine, and hexacene-6,15-quinone. In addition, the organic semiconductor material is, for example, anthradithiophene, dinaphto[2,3-b:2',3'-f]thieno[3,2-b]thienophen, peri-xanthenoxanthene compound such as 2,9-diphenyl-peri-xanthenoxanthene, or 2,9-dinaphthyl-peri-xanthenoxanthene, or copper phthalocyanine or the like.

The upper organic semiconductor layer 3B is disposed in each of the area R1 overlapping with the source electrode 4 and the area R2 overlapping with the drain electrode 5, so that the respective upper organic semiconductor layers 3B are spaced apart from each other. The upper organic semiconductor layer 3B has solubility and conductivity higher than those of the lower organic semiconductor layer 3A.

The "solubility" mentioned above is the solubility in a solvent such as an organic solvent. In addition, the "high solubility" is the solubility to obtain, when the lower organic semiconductor layer 3A and the upper organic semiconductor layer 3B are caused to contact a solvent, such a selectivity that the upper organic semiconductor layer 3B is dissolved (removed) whereas the lower organic semiconductor layer 3A is not dissolved (remain as it is). The materials of the lower organic semiconductor layer 3A and the upper organic semiconductor layer 3B (the combination of the organic semiconductor materials) are selected so that the above-described selectivity for the solubility is obtained.

This upper organic semiconductor layer 3B is formed of, for example, one or more kind of organic semiconductor material doped to achieve low resistance. The organic semiconductor material (main material) before the doping is, for example, α-quaterthiophene, poly-(β-hexylthiophene), or poly(2,5-bis(3-dodecyl-5-(3-dodecylthiophene-2-yl) thiophene-2-yl)thiazolo[5,4-d]thiazole. A doping material is, for example, a charge-transfer complex such as tetracyano quinodimethan (TCNQ), or tetrafluoro TCNQ (F4-TCNQ), which is a p-type doping material. The ionization potential of the upper organic semiconductor layer 3B is desired to be smaller than the ionization potential of the lower organic semiconductor layer 3A. This is because an electric charge is made to easily move inside of the organic semiconductor layer 3.

Above all, it is desirable that the material (main material) of forming the upper organic semiconductor layer 3B be a material into which a substituent to give the solubility to the material of forming the lower organic semiconductor layer 3A (a derivative of the material of forming the lower organic semiconductor layer 3A) is introduced. This is because when the solubility of a material having no substituent is sufficiently low, the difference in solubility to a material having a substituent is large and thus, a sufficient selectivity is achieved.

For instance, the material of forming the lower organic semiconductor layer 3A is pentacene expressed in chemical formula (1), the material (main material) of forming the upper organic semiconductor layer 3B is a derivative of the pentacene expressed in chemical formula (2). "i-Pr" shown in chemical formula (2) represents an isopropyl group. This derivative is a material in which two triisopropylsilylethynyl (TIPS) groups are introduced into the pentacene as a side chain. Incidentally, the introduction position and the number of TIPS groups are not limited to the case shown in chemical formula (2), and can be modified freely.

Chemical formula (1)

Chemical formula (2)

Here, as the solvent mentioned above, there is dichloromethane, Tetralin, xylene, or the like. In this case, the solubility of pentacene in the solvent is approximately zero, and the pentacene hardly dissolves, but the solubility of the derivative in the solvent becomes drastically higher than the pentacene, and the derivative dissolves easily. The combination of these pentacene and derivative is desirable also in the sense that while the derivative is soluble, both can be formed by using vacuum deposition or the like.

The source electrode 4 and the drain electrode 5 are formed of, for example, the same material as the gate electrode 1 mentioned above, and is desired to be in ohmic contact with the organic semiconductor layer 3.

Incidentally, the organic TFT may include a component other than those described above. As such other component, there is, for example, a substrate that supports the organic TFT. This substrate may be, for example, a substrate made of glass, a plastic material, a metallic material, or the like, or may be a film made of the plastic material, the metallic material or the like, or may be a sheet of paper (general paper). The plastic material is polyethersulfone (PES), polycarbonate (PC), polyimide (PI), polyethylene terephthalate (PET), polyethylene naphthalate (PEN), polyethyl ether ketones (PEEK), or the like. The metallic material is aluminum, nickel, stainless steel, or the like. Incidentally, the surface of the substrate may be provided with, for example, various kinds of layer such as a buffer layer to secure adhesion, and a gas barrier layer to prevent gas emission.

Method of Producing Organic TFT

Figure 2:
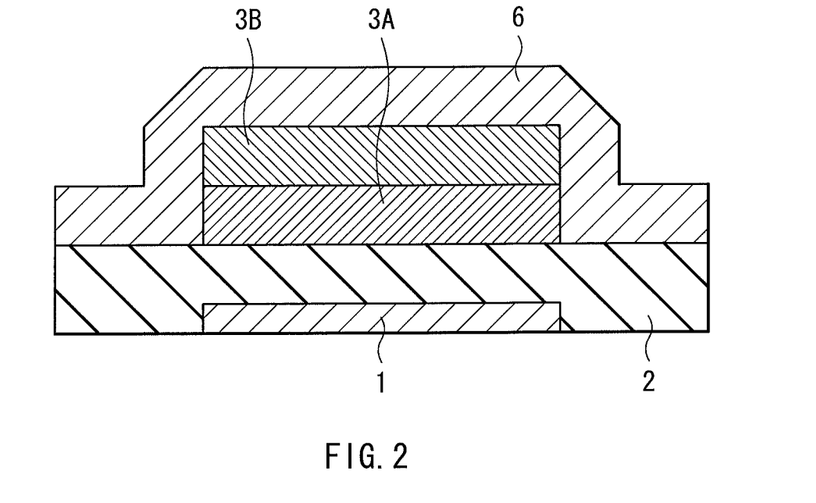
FIG. 2 is a cross-sectional diagram intended for description of a method of manufacturing the thin-film transistor.
Figure 3:
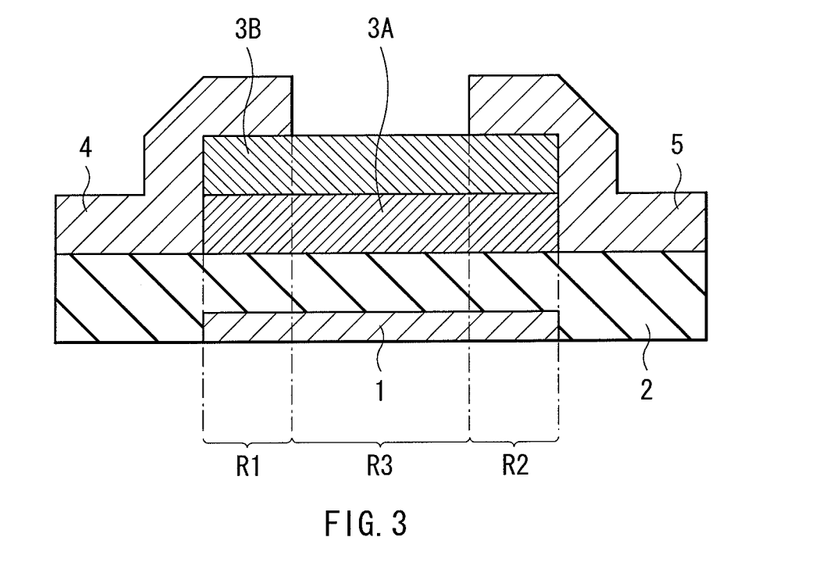
FIG. 3 is a cross-sectional diagram intended for description of a process subsequent to FIG. 2.

This organic TFT is produced in the following procedure. FIG. 2 and FIG. 3 are intended for description of a method of manufacturing the organic TFT, and illustrate cross-sectional configurations corresponding to FIG. 1. Since the materials of forming a series of components have been already described above, their description will be omitted in the following. Incidentally, the method of manufacturing the organic TFT to be described here is merely presented as an example, and the materials of forming the respective components and the formation methods can be modified as appropriate.

First, as illustrated in FIG. 2, the gate electrode 1 is formed. In this case, for example, after a metallic material layer is formed, a mask (not illustrated) such as a resist pattern is formed on the metallic material layer. Subsequently, after the metallic material layer is etched by using the mask, the mask after being used is removed by ashing, etching or the like. The method of forming the metallic material layer is vacuum film formation, coating, plating, or the like. The vacuum film formation is vacuum deposition, flash evaporation, sputtering, Physical Vapor Deposition (PVD), Chemical Vapor Deposition (CVD), Pulsed Laser Deposition (PLD), arc discharge method, or the like. The coating is spin coating, slit coating, bar coating, spray coating, or the like. The plating is electrolytic plating, electroless plating, or the like. When the resist pattern is formed, for example, after a photoresist film is formed by application of a photoresist, the photoresist film is patterned by using photolithography, laser drawing, electron beam lithography, X-rays drawing, or the like. However, the resist pattern may be formed by using resist transfer or the like. The method of etching the metallic material layer is, for example, dry etching or wet etching using an etchant solution, and the dry etching is, for example, ion milling or Reactive Ion Etching (RIE). The etching for removing the mask is similar. Incidentally, the method of forming the gate electrode 1 may be, for example, printing such as inkjet printing, screen printing, gravure printing, or gravure offset printing. In addition, instead of the resist pattern, a metal pattern may be formed as the mask by using a laser ablation method, mask vacuum deposition, laser transfer, or the like. Of course, in order to form the gate electrode 1, an inorganic conductive material layer, an organic conductive material layer, a carbon material layer, or the like may be formed in place of the metallic material layer.

Subsequently, the gate insulating layer 2 is formed to cover the gate electrode 1. Formation procedures of this gate insulating layer 2 differ according to the formation material, for example. The formation procedure when an inorganic insulating material is used is similar to the case in which the gate electrode 1 is formed, except that the coating may be a sol-gel method or the like. The formation procedure when an organic insulating material is used is similar to the case in which the gate electrode 1 is formed, except that a photosensitive material may be patterned by using the photolithography.

Subsequently, on the gate insulating layer 2, the lower organic semiconductor layer 3A is patterned by using the pentacene illustrated in chemical formula (1). In this case, the procedure similar to the case in which the gate electrode 1 is formed is used. Specifically, after the lower organic semiconductor layer 3A is formed to cover the gate insulating layer 2, the lower organic semiconductor layer 3A is etched by using the photolithography.

Subsequently, on the lower organic semiconductor layer 3A, the upper organic semiconductor layer 3B is patterned by using the derivative of the pentacene shown in chemical formula (2) or the like and a doping material. In this case, the procedure and formation method similar to those in the case in which the lower organic semiconductor layer 3A is formed, and the upper organic semiconductor layer 3B is formed to extend from the region R1 to the region R2.

Incidentally, instead of patterning the lower organic semiconductor layer 3A and the upper organic semiconductor layer 3B individually, both may be patterned at a time. In this case, after the lower organic semiconductor layer 3A and the upper organic semiconductor layer 3B are laminated to cover the surface of the gate insulating layer 2, the lower organic semiconductor layer 3A and the upper organic semiconductor layer 3B may be patterned at a time by using the photolithography, the laser ablation method, or the like.

When the lower organic semiconductor layer 3A and the upper organic semiconductor layer 3B are formed, it is desirable to use, for example, vacuum film formation such as vacuum deposition or sputtering for both layers. This is because the upper organic semiconductor layer 3B is disposed on the lower organic semiconductor layer 3A in a vacuum environment and thus, mixing of a foreign matter into an interface between these two layers is less likely to occur and resistance to damage is attained. In this case, the main material and the doping material may be evaporated together.

Subsequently, an electrode layer 6 is formed to cover the lower organic semiconductor layer 3A, the upper organic semiconductor layer 3B and the peripheral gate insulating layer 2. This electrode layer 6 is a preparation layer to form the source electrode 4 and the drain electrode 5, and as its formation material, the same material as those of the source electrode 4 and the drain electrode 5 is used. The method of forming the electrode layer 6 is, for example, similar to the case in which the gate electrode 1 is formed, and a method less likely to damage the lower organic semiconductor layer 3A and the upper organic semiconductor layer 3B is particularly desirable.

Subsequently, the electrode layer 6 is selectively etched, and as illustrated in FIG. 3, the source electrode 4 and the drain electrode 5 are formed. In this case, a procedure similar to the case in which the gate electrode 1 is formed is used. Specifically, after a resist pattern is formed on the electrode layer 6, the electrode layer 6 is etched by using the resist pattern as a mask. In particular, as a method of etching the electrode layer 6, for example, the wet etching or the like which is less likely to damage the lower organic semiconductor layer 3A and the upper organic semiconductor layer 3B is desirable. In this case, the solubility of the upper organic semiconductor layer 3B in an etchant solution is made to be small to the extent that the solubility can be ignored.

Finally, the upper organic semiconductor layer 3B is selectively caused to dissolve with a solvent, by using the source electrode 4 and the drain electrode 5 as a mask. The kind of this solvent is freely selectable, according to the formation materials of the lower organic semiconductor layer 3A and the upper organic semiconductor layer 3B (a selectivity related to the degrees of solubility of both). As a result, as illustrated in FIG. 1, a part of the upper organic semiconductor layer 3B (a part located in the region R3) is removed, and the upper organic semiconductor layer 3B remains in only the regions R1 and R2. In this case, although the lower organic semiconductor layer 3A is exposed on a region where the upper organic semiconductor layer 3B has dissolved, the lower organic semiconductor layer 3A hardly dissolves according to the selectivity. This completes the organic TFT.

Operation and Effect Related to Organic TFT and Method of Manufacturing the Same According to the organic TFT and the method of manufacturing the same described above, the upper organic semiconductor layer 3B has the solubility and the conductivity higher than those of the lower organic semiconductor layer 3A. In this case, the upper organic semiconductor layer 3B is removed selectively by simple dissolution processing that employs a solvent such as an organic solvent, even if the oxygen plasma etching is not used. Besides, by setting the degrees of solubility of the lower organic semiconductor layer 3A and the upper organic semiconductor layer 3B so that the sufficient selectivity is obtained, only the upper organic semiconductor layer 3B dissolves, while the lower organic semiconductor layer 3A hardly dissolves. As a result, the lower organic semiconductor layer 3A is formed to extend from the region R1 to the region R2, and the upper organic semiconductor layer 3B is formed so that the upper organic semiconductor layers 3B on the regions R1 and R2 are spaced apart from each other and therefore, the channel etch type of organic TFT with the organic semiconductor layer 3 is readily produced with stability. Accordingly, the mobility and the ON-OFF ratio improve and thus, the performance can be enhanced.

2. Application Example (Electronic Device) of Organic TFT

Next, an application example of the above-described organic TFT will be described. For instance, this organic TFT is applicable to some electronic devices, as will be described below sequentially.

2-1. Liquid Crystal Display Device

Figure 4:
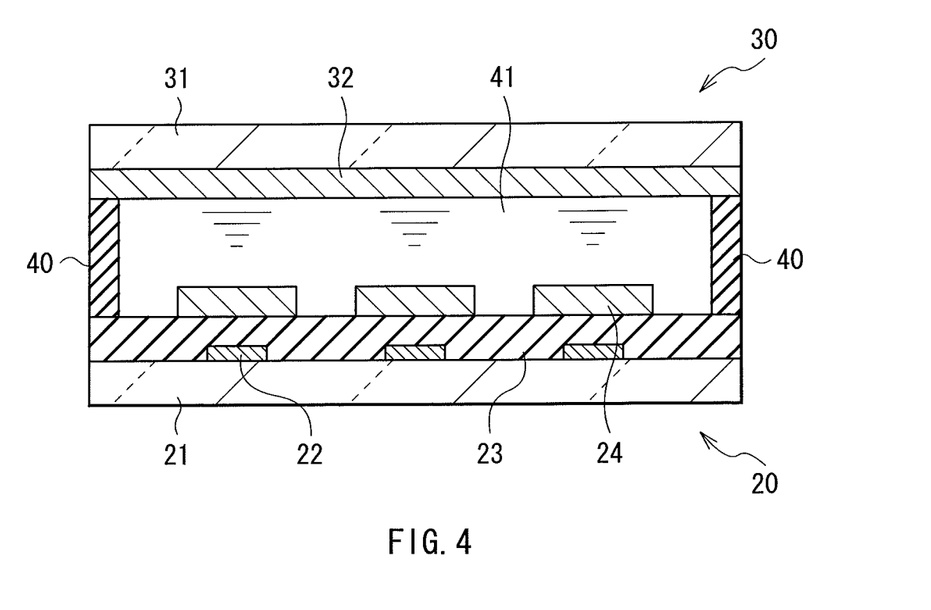
FIG. 4 is a cross-sectional diagram illustrating a configuration of a main part of a liquid crystal display device that is an application example of the thin-film transistor.
Figure 5:
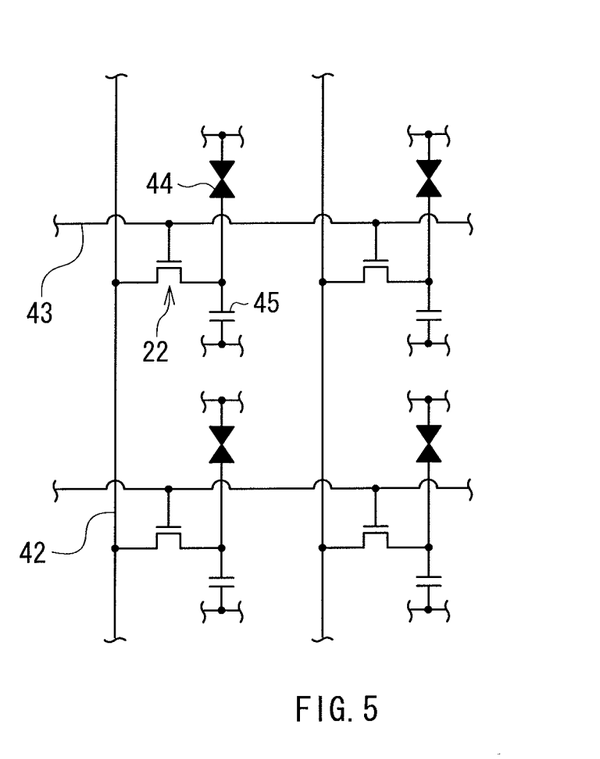
FIG. 5 is a diagram illustrating a circuit configuration of the liquid crystal display device illustrated in FIG. 4.

The organic TFT is applied to, for example, a liquid crystal display device. FIG. 4 and FIG. 5 illustrate a cross-sectional configuration and a circuit configuration, respectively, of a main part of the liquid crystal display device. Incidentally, the device configuration (FIG. 4) and the circuit configuration (FIG. 5) to be described below are merely presented as examples, and can be modified as appropriate.

The liquid crystal display device described here is, for example, a transmissive liquid crystal display in an active matrix drive system using the organic TFT, and the organic TFT is used as a switching (pixel selection) element. In this liquid crystal display device, as illustrated in FIG. 4, a liquid crystal layer 41 is enclosed between a drive board 20 and an opposite board 30.

The drive board 20 is, for example, a board in which an organic TFT 22, a planarizing dielectric layer 23 and a pixel electrode 24 are formed in this order on one surface of a supporting board 21, and the plural organic TFTs 22 and pixel electrodes 24 are arranged in a matrix. However, the number of organic TFTs 22 included in one pixel may be one, or more than one. FIG. 4 and FIG. 5 illustrate, as an example, a case in which the one organic TFT 22 is included in one pixel.

The supporting board 21 is formed of, for example, a transmissive material such as glass or a plastic material, and the organic TFT 22 has a configuration similar to the organic TFT described earlier. The type of the plastic material is, for example, similar to the case described above for the organic TFT, and this also applies to a case that will be described below as occasion arises. The planarizing dielectric layer 23 is formed of, for example, an insulating resin material such as polyimide, and the pixel electrode 24 is formed of, for example, a transmissive conductive material such as ITO. Incidentally, the pixel electrode 24 is connected to the organic TFT 22 through a contact hole (not illustrated) provided in the planarizing dielectric layer 23.

The opposite board 30 is, for example, a board in which an opposite electrode 32 is formed all over one surface of a supporting board 31. The supporting board 31 is formed of, for example, a transmissive material such as glass or a plastic material, and the opposite electrode 32 is formed of, for example, a conductive material such as ITO.

The drive board 20 and the opposite board 30 are disposed to have the pixel electrode 24 and the opposite electrode 32 facing each other with the liquid crystal layer 41 interposed in between, and bonded together with a sealant 40. The type of liquid crystal molecules included in the liquid crystal layer 41 is freely selectable.

In addition, for example, the liquid crystal display device may include other components such as a phase difference plate, a polarizing plate, an oriented film and a backlight unit (none of them illustrated).

The circuit for driving the liquid crystal display device includes, for example, as illustrated in FIG. 5, the organic TFT 22 and a liquid crystal display element 44 (an element section including the pixel electrode 24, the opposite electrode 32 and the liquid crystal layer 41), and a capacitor 45. In this circuit, plural signal lines 42 are arranged in a row direction, and plural scanning lines 43 are arranged in a column direction, and at each intersection of them, the organic TFT 22, the liquid crystal display element 44 and the capacitor 45 are disposed. The destinations to which the source electrode, the gate electrode and the drain electrode in the organic TFT 22 are connected are not limited to the case illustrated in FIG. 5, and can be set freely. The signal lines 42 and the scanning lines 43 are connected to a signal line driving circuit (a data driver) and a scanning line driving circuit (a scanning driver) which are not illustrated, respectively.

In this liquid crystal display device, when the liquid crystal display element 44 is selected by the organic TFT 22, and an electric field is applied between its pixel electrode 24 and opposite electrode 32, the oriented state of the liquid crystal molecules in the liquid crystal layer 41 changes according to its electric field strength. As a result, the amount of optical transmission (transmissivity) is controlled according to the oriented state of the liquid crystal molecules and thus, a tone image is displayed.

According to this liquid crystal display device, the organic TFT 22 has the configuration similar to that of the organic TFT described earlier and thus, the mobility and the ON-OFF ratio improve. Therefore, the display performance can be enhanced. Incidentally, the liquid crystal display device is not limited to the transmission type, and may be a reflection type.

2-2. Organic EL Display Device

Figure 6:
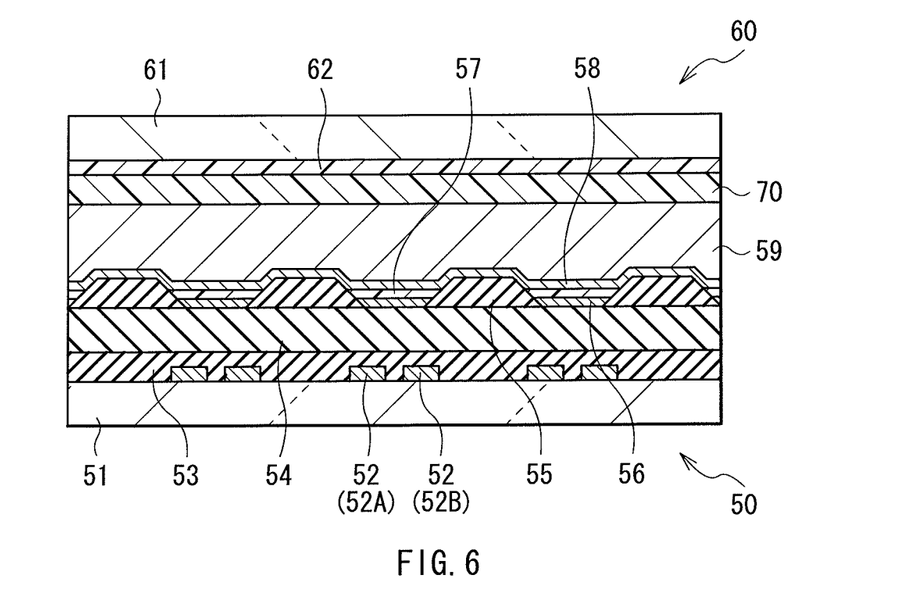
FIG. 6 is a cross-sectional diagram illustrating a configuration of a main part of an organic electroluminescent (EL) display device that is an application example of the thin-film transistor.
Figure 7:
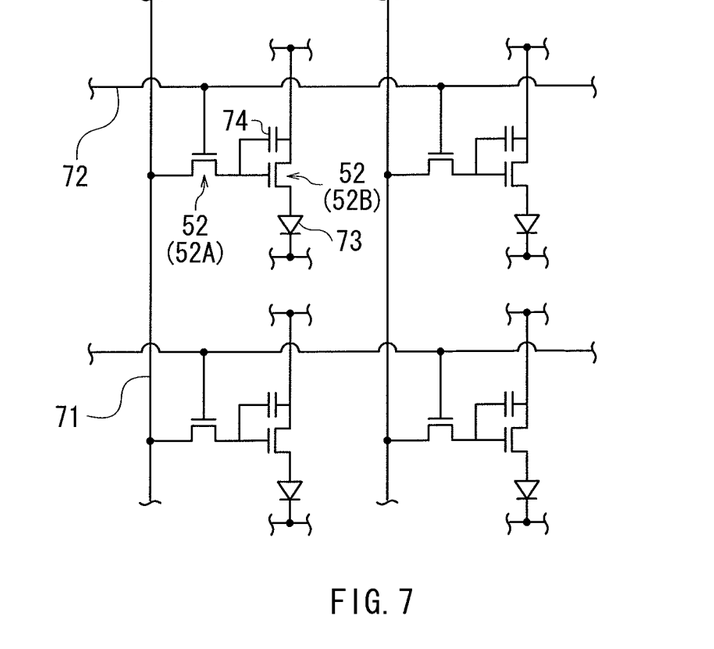
FIG. 7 is a diagram illustrating a circuit configuration of the organic EL display device illustrated in FIG. 6.

The organic TFT is applied to, for example, an organic EL display device. FIG. 6 and FIG. 7 illustrate a cross-sectional configuration and a circuit configuration, respectively, of a main part of the organic EL display device. Incidentally, the device configuration (FIG. 6) and the circuit configuration (FIG. 7) to be described below are merely presented as examples, and can be modified as appropriate.

The organic EL display device described here is, for example, an organic EL display in an active matrix drive system which uses the organic TFT as a switching element. This organic EL display device is configured such that a drive board 50 and an opposite board 60 are bonded together with an adhesive layer 70 and is, for example, a top emission type that emits light via the opposite board 60.

In the drive board 50, for example, an organic TFT 52, a protective layer 53, a planarizing dielectric layer 54, a pixel separation insulating layer 55, a pixel electrode 56, an organic layer 57, an opposite electrode 58 and a protective layer 59 are formed in this order on one surface of a supporting board 51. The plural organic TFTs 52, pixel electrodes 56 and organic layers 57 are arranged in a matrix. However, the number of organic TFTs 52 included in one pixel may be one, or more than one. FIG. 6 and FIG. 7 illustrate, as an example, a case in which the two organic TFTs 52 (a selection TFT 52A and a drive TFT 52B) are included in one pixel.

The supporting board 51 is formed of glass, a plastic material or the like. In the top emission type, the light is taken out from the opposite board 60 and thus, the supporting board 51 may be formed of either a transmissive material or a non-transmissive material. The organic TFT 52 has a configuration similar to that of the organic TFT described earlier, and the protective layer 53 is formed of, for example, a polymeric material such as poly-vinyl alcohol (PVA) or poly-para-xy-lylene. The planarizing dielectric layer 54 and the pixel separation insulating layer 55 are formed of, for example, an insulating resin material such as polyimide. For example, it is desirable that in order to simplify a formation process and to enable formation in a desired shape, this pixel separation insulating layer 55 be formed of a photosensitive resin material capable of being molded by light patterning, reflow or the like. Incidentally, the planarizing dielectric layer 54 may be omitted when sufficient flatness is achieved by the protective layer 53.

The pixel electrode 56 is formed of, for example, a reflective material such as aluminum, silver, titanium or chromium, and the opposite electrode 58 is formed of, for example, a transmissive conductive material such as ITO or IZO. However, the opposite electrode 58 may be formed of, for example, a transmissive metallic material such as calcium (Ca), its alloy, or a transmissive organic conductive material such as PEDOT. The organic layer 57 includes a light-emitting layer that emits light of red, green or blue, and may be a layered structure including a hole transport layer, an electron transport layer and the like as needed. The material of forming the light-emitting layer can be freely selected according to the color of the light to be emitted. The pixel electrodes 56 and the organic layers 57 are arranged in a matrix while being spaced with the pixel separation insulating layers 55, whereas the opposite electrode 58 extends continuously while facing the pixel electrodes 56 via the organic layer 57. The protective layer 59 is formed of, for example, a light-transmissive dielectric material such as silicon oxide (SiOx), aluminum oxide (AlOx), a silicon nitride (SiN), poly-para-xylylene or urethane. Incidentally, the pixel electrode 56 is connected to the organic TFT 52 through a contact hole (not illustrated) provided in the protective layer 53 and the planarizing dielectric layer 54.

The opposite board 60 is, for example, a board in which a color filter 62 is provided on one surface of a supporting board 61. The supporting board 61 is formed of, for example, a transmissive material such as glass, a plastic material or the like, and the color filter 62 has plural color regions corresponding to the colors of light produced in the organic layers 57. However, the color filter 62 may be omitted.

The adhesive layer 70 is, for example, an adhesive such as thermosetting resin.

The circuit for driving the organic EL display device includes, for example, as illustrated in FIG. 7, the organic TFTs 52 (the selection TFT 52A and the drive TFT 52B) and an organic EL display element 73 (an element section including the pixel electrode 56, the organic layer 57 and the opposite electrode 58), and a capacitor 74. In this circuit, at each intersection of the plural signal lines 71 and the scanning lines 72, the organic TFTs 52, the organic EL display element 73 and the capacitor 74 are disposed. The destinations to which the source electrode, the gate electrode and the drain electrode in each of the selection TFT 52A and the drive TFT 52B are not limited to the case illustrated in FIG. 7, and can be set freely.

In this organic EL display device, for example, when the organic EL display element 73 is selected by the selection TFT 52A, this organic EL display element 73 is driven by the drive TFT 52B. Thus, when an electric field is applied between the pixel electrode 56 and the opposite electrode 58, light emission occurs in the organic layer 57. In this case, for example, in each of the adjacent three organic EL display elements 73, light of red, green or blue is produced. Synthetic light of these lights is emitted via the opposite board 60 to the outside and thus, a tone image is displayed.

According to this organic EL display device, the organic TFT 52 has the configuration similar to that of the organic TFT described earlier and thus, the display performance can be enhanced, like the liquid crystal display device.

Incidentally, the organic EL display device is not limited to the top emission type, and may be a bottom emission type that emits light via the drive board 50, or may be a dual emission type that emits light via both of the drive board 50 and the opposite board 60. In this case, of the pixel electrode 56 and the opposite electrode 58, the electrode on the side where the light is emitted is formed of a transmissive material, and the electrode on the side where the light is not emitted is formed of a reflective material.

2-3. Electronic Paper Display Device

Figure 8:
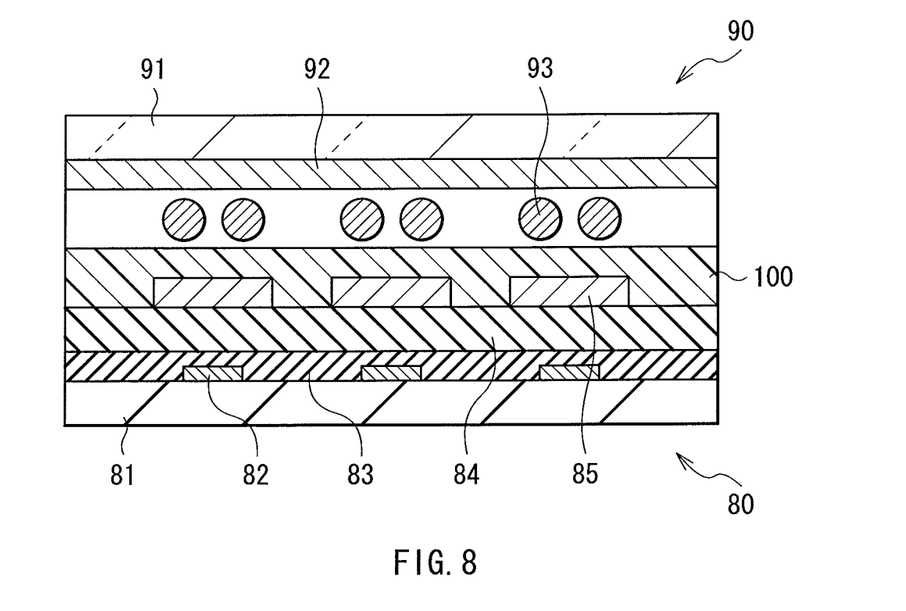
FIG. 8 is a cross-sectional diagram illustrating a configuration of a main part of an electronic paper display device that is an application example of the thin-film transistor.

The organic TFT is applied to, for example, an electronic paper display device. FIG. 8 illustrates a cross-sectional configuration of the electronic paper display device.

Incidentally, the device configuration (FIG. 8) and a circuit configuration to be described below with reference to FIG. 5 are merely presented as examples, and can be modified as appropriate.

The electronic paper display device described here is, for example, an electronic paper display in an active matrix drive system that uses the organic TFT as a switching element. This electronic paper display device is, for example, a device in which a drive board 80 and an opposite board 90 including plural electrophoretic elements 93 are bonded together through an adhesive layer 100.

The drive board 80 is, for example, a board in which an organic TFT 82, a protective layer 83, a planarizing dielectric layer 84 and a pixel electrode 85 are formed in this order on one surface of a supporting board 81, and the plural organic TFTs 82 and pixel electrodes 85 are arranged in a matrix. The supporting board 81 is formed of glass, a plastic material or the like, and the organic TFT 82 has a configuration similar to that of the organic TFT described earlier. The protective layer 83 and the planarizing dielectric layer 84 are formed of, for example, an insulating resin material such as polyimide, and the pixel electrode 85 is formed of, for example, a metallic material such as silver (Ag). Incidentally, the pixel electrode 85 is connected to the organic TFT 82 through a contact hole (not illustrated) provided in the protective layer 83 and the planarizing dielectric layer 84. When sufficient flatness is achieved by the protective layer 83, the planarizing dielectric layer 84 may be omitted.

In the opposite board 90, for example, an opposite electrode 92 and a layer including the plural electrophoretic elements 93 are formed in this order on one surface of a supporting board 91, and the opposite electrode 92 is formed all over the surface. The supporting board 91 is formed of, for example, a transmissive material such as glass or a plastic material, and the opposite electrode 92 is formed of, for example, a transmissive conductive material such as ITO. The electrophoretic element 93 is, for example, an element in which charged particles are dispersed in an insulating liquid, and enclosed in a micro capsule. The charged particles include, for example, black particles that are graphite fine particles and white particles that are titanium oxide fine particles.

In addition, the electronic paper display device may include, for example, other components (not illustrated) such as a color filter.

The circuit for driving the electronic paper display device has, for example, a configuration similar to the circuit of the liquid crystal display device illustrated in FIG. 5. The circuit of the electronic paper display device includes, in place of the organic TFT 22 and the liquid crystal display element 44, the organic TFT 82 and an electronic paper display element (an element section including the pixel electrode 85, the opposite electrode 92 and the electrophoretic element 93), respectively.

In this electronic paper display device, when the electronic paper display element is selected by the organic TFT 82 and an electric field is applied between its pixel electrode 85 and opposite electrode 92, the black particles or the white particles in the electrophoresis element 93 are drawn to the opposite electrode 92 according to the electric field. As a result, contrast is expressed by the black particles and the white particles and thus, a tone image is displayed.

According to this electronic paper display device, the organic TFT 82 has the configuration similar to that of the organic TFT described earlier and therefore, the display performance can be enhanced like the liquid crystal display device.

Up to this point, the present application has been described by using the embodiment, but the present application is not limited to the features described for the embodiment, and can be variously modified. For example, the structure of the thin-film transistor of the present application is not limited to the top-contact bottom-gate type, and may be a top-contact top-gate type. In this case as well, a channel etch type of organic TFT provided with an organic semiconductor layer (a lower organic semiconductor layer and an upper organic semiconductor layer) can be readily produced with stability and thus, effects similar to those of the top-contact bottom-gate type can be obtained.

Further, for example, the electronic device to which the thin-film transistor of the present application is applied is not limited to the liquid crystal display device, the organic EL display device or the electronic paper display device, and may be other display devices. For example, as one of such other display devices, there is a MEMS (Micro Electro Mechanical Systems) display unit. In this case as well, the display performance can be enhanced.

Furthermore, for example, the thin-film transistor of the present application may be applied to electronic devices other than the display device. For example, as one of such electronic devices, there is a sensor matrix or a memory cell. In this case as well, the mobility and the ON-OFF ratio of the thin-film transistor improve and thus, the performance can be enhanced.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A method of producing a thin-film transistor, the method comprising:
    forming a lower organic semiconductor layer;
    forming an upper organic semiconductor layer on the lower organic semiconductor layer, the upper organic semiconductor layer having solubility and conductivity higher than those of the lower organic semiconductor layer; and
    dissolving the upper organic semiconductor layer selectively by using the solubility higher than that of the lower organic semiconductor layer in a solvent and using the source electrode and the drain electrode as a mask such that the upper organic semiconductor layers remain only in each of the regions overlapping the source and the drain electrodes, and the respective upper organic semiconductor layers are spaced apart from each other.

2. The method of producing a thin-film transistor according to claim 1, wherein an ionization potential of the upper organic semiconductor layer is made smaller than an ionization potential of the lower organic semiconductor layer.

3. The method of producing a thin-film transistor according to claim 1, wherein the upper organic semiconductor layer includes a material into which a substituent for giving solubility to a material forming the lower organic semiconductor layer is introduced.

4. The method of producing a thin-film transistor according to claim 1, wherein the upper organic semiconductor layer includes a doping material for reducing resistance.

5. The method of producing a thin-film transistor according to claim 1, wherein the method further comprises forming a gate insulating layer on the gate electrode.

* * * * *